(12) United States Patent
Ishioka et al.

(10) Patent No.: US 6,972,573 B2
(45) Date of Patent: Dec. 6, 2005

(54) DEVICE AND METHOD FOR INSPECTING CIRCUIT BOARD

(75) Inventors: Shogo Ishioka, Fukayasu-gun (JP); Shuji Yamaoka, Fukuyama (JP)

(73) Assignee: OHT Inc., Hiroshima (JP)

( * ) Notice: Subject to any disclaimer, the term of this patent is extended or adjusted under 35 U.S.C. 154(b) by 107 days.

(21) Appl. No.: 10/069,522

(22) PCT Filed: Jun. 13, 2001

(86) PCT No.: PCT/JP01/04994

§ 371 (c)(1),
(2), (4) Date: May 29, 2002

(87) PCT Pub. No.: WO01/96891

PCT Pub. Date: Dec. 20, 2001

(65) Prior Publication Data

US 2002/0163341 A1  Nov. 7, 2002

(30) Foreign Application Priority Data

Jun. 16, 2000 (JP) .............................. 2000-182118

(51) Int. Cl.[7] .......................... G01R 31/08; G01R 31/28
(52) U.S. Cl. ...................................... 324/523; 324/528
(58) Field of Search .............................. 324/523, 538, 324/525, 750

(56) References Cited

U.S. PATENT DOCUMENTS 6,097,202 A * 8/2000 Takahashi .................... 324/761
6,703,849 B2 * 3/2004 Ishioka et al. ............... 324/750

* cited by examiner

*Primary Examiner*—Vincent Q. Nguyen
*Assistant Examiner*—John Teresinski
(74) *Attorney, Agent, or Firm*—Westerman, Hattori, Daniels & Adrian, LLP

(57) ABSTRACT

The present invention provides an inspection apparatus and an inspection method capable of inspecting at a high speed by using a sensor having flexibility and excellent productivity. When a circuit board 100 as a subject of inspection is selected, CAD data of the circuit wiring 101 on this circuit board 100 is analyzed to detect the position of the end of each wiring. Then, two or more sensor elements adjacent to the end (from which the voltage variation can be detected) are specified. The switching circuit 16 is controlled to connect the selected sensor elements to an output terminal 12 and to connect the remaining sensor elements to the GND terminal 15. In this state, when an voltage is applied to one of the selected circuit wirings and then an inspection signal (voltage variation) is output from the output terminal 12, it will be determined that no disconnection exists in the circuit wiring.

7 Claims, 6 Drawing Sheets

DEVICE AND METHOD FOR INSPECTING CIRCUIT BOARD

TECHNICAL FIELD

The present invention relates to an inspection apparatus and inspection method for a circuit board.

BACKGROUND ART

In manufacturing processes of a circuit board, after forming circuit wirings on a board, it is required to inspect the presence of disconnection or short-circuit in the circuit wirings.

The recent progressive densification of the circuit wirings makes it difficult to assure a sufficient space for arranging pins simultaneously and bringing them into contact with the circuit wiring. Thus, a non-contact type inspection technique has been proposed in which electric signals were received without using any pin and bringing it into contact with the circuit wiring (see Japanese Patent Laid-Open Publication No. Hei 9-264919).

However, for the non-contact type inspection technique, the configuration of a sensor is designed using CAD data of a board, and then the sensor is fabricated by means of a mechanical technique, such as machining or etching. In this case, it has been required to fabricate the sensor in conformity with the configuration of the sensor on each board, resulting in degraded production efficiency of the sensor. While there has been an inspection apparatus having sensors arranged in a matrix form, all of the sensor elements have been scanned, resulting in undesirably increased processing time.

The present invention is directed to solve the above problems of the prior arts. It is therefore an object of the present invention to provide an inspection apparatus and an inspection method capable of inspecting at a high speed by using a sensor having flexibility and excellent productivity.

DISCLOSURE OF INVENTION

In order to achieve the above object, the present invention provides an inspection apparatus for inspecting a circuit wiring on a circuit board, comprising supply means for supplying an electric signal to one of the ends of a circuit wiring and varying a voltage in the circuit wiring, sensor means including a plurality of sensor elements arranged in an array and each adapted to generate an inspection signal in response to voltage variation of a conductor adjacent thereto, sensor element select means for selecting at least one sensor element adjacent to the other end of the circuit wiring among the plurality of sensor elements, and output means for outputting the inspection signal from the selected sensor element.

The supply means may be adapted to supply the electric signal to selected one of a plurality of circuit wirings on the circuit board, and the sensor element select means may be adapted to select all of the sensor elements adjacent to respective ends of the plurality of circuit wirings. In this case, when the inspection signal is generated in at least one of the sensor elements selected by the sensor element select means, the output means may be adapted to output this inspection signal.

The sensor element select means may include a first switching means for controlling the connection between each of the sensor elements and the ground, and a second switching means for controlling the connection between each of the sensor elements and the output means.

The inspection apparatus may further include detect means for detecting a disconnection in the circuit wiring according to the inspection signal output from the output means.

The present invention further provides an inspection system for inspecting a circuit wiring on a circuit board, comprising the above inspection apparatus in the plural number. The inspection apparatuses are adapted to be disposed opposed to the circuit board.

This inspection system may further include a universal tester adapted to be connected to the plurality of inspection apparatuses.

In order to achieve the above object, the present invention provides an inspection method for inspecting a circuit wiring on a circuit board by using sensor means including a plurality of sensor elements arranged in an array and each adapted to generate an inspection signal in response to voltage variation of a conductor adjacent thereto, comprising the steps of supplying the electric signal to one of the ends of the circuit wiring and varying a voltage in the circuit wiring, selecting at least one sensor element adjacent to the other end of the circuit wiring among the plurality of sensor elements, and detecting a disconnection in the circuit wiring according to an output signal output from the sensor element selected in the step of selecting at least one sensor element.

In this inspection method, a plurality of circuit wirings on the circuit board may be simultaneously inspected by arranging the sensor means in the plural number.

The term "arrangement in an array" herein means the state where the sensor elements are arranged according to a given rule, such as a matrix arrangement.

BEST MODE FOR CARRYING OUT THE INVENTION

With referring to drawings, preferred embodiments of the present invention will be described in detail as an example. The relative arrangement, numerical value and the like of components or elements described in the embodiments are not intended to limit the scope of the present invention unless defined by a specific description.

(First Embodiment)

As a first embodiment of the present invention, an inspection system 20 using a panel electrode arranged in a matrix form as a sensor element will be described.

<Construction of Inspection System>

Figure 2:
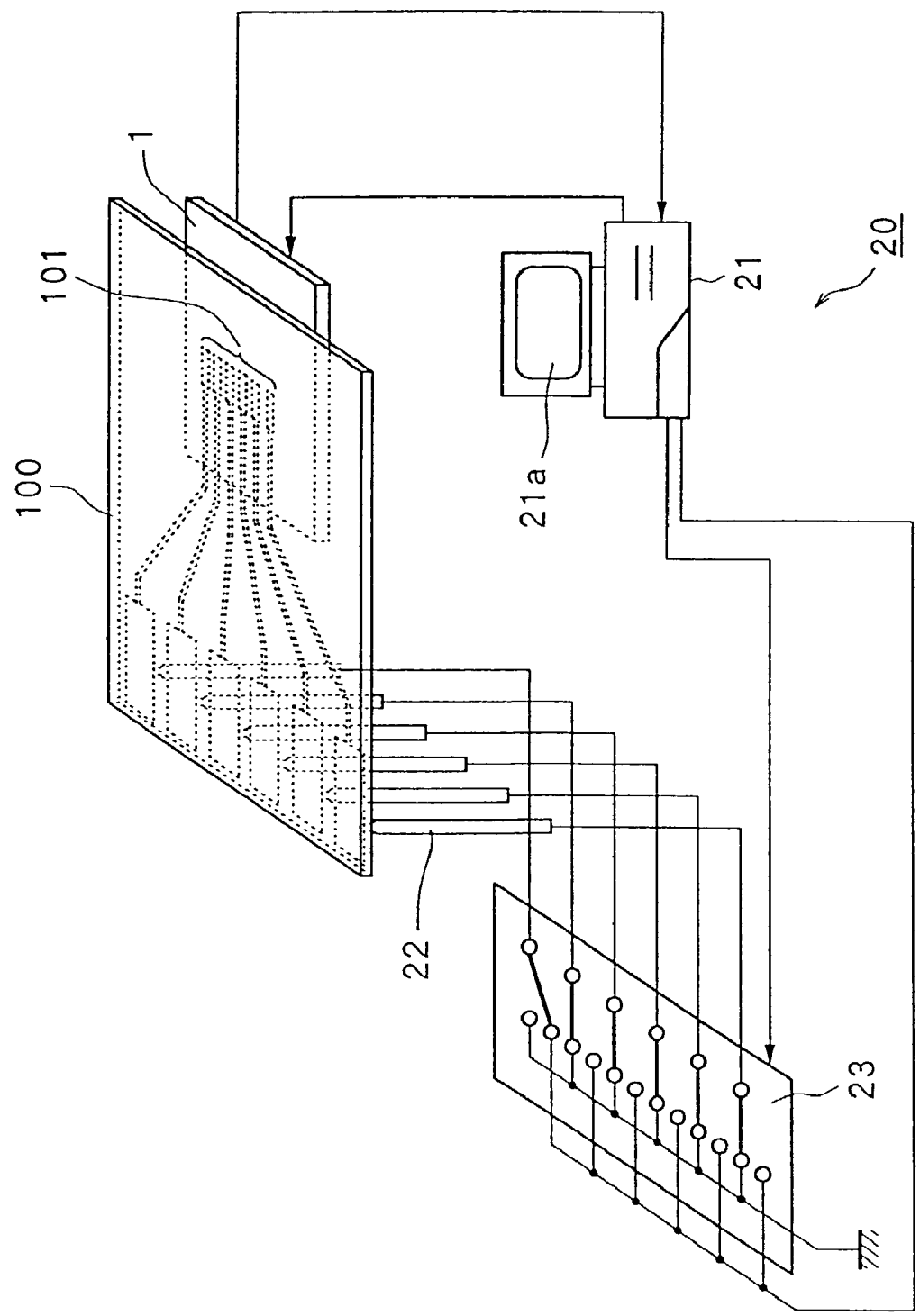
FIG. 2 is a schematic diagram of an inspection system according to the first embodiment of the present invention.

FIG. 2 is a schematic diagram of an inspection system 20 for inspecting circuit wirings 101 on a circuit board 100.

The inspection system 20 comprises a sensor unit 1 including a plurality of sensor elements, a computer 21, a plurality of probes 22 each for supplying an inspection signal to the circuit wiring 101, and a selector 23 for switching the supply of the inspection signal to the probe 22. The selector 23 may be composed, for example, of a multiplexer, demultiplexer and others.

The computer 21 supplies to the selector 23 a control signal for selecting the probe 22 and an electric signal to be applied to the circuit wiring 101. The computer 21 also supplies to the sensor unit 1 a select signal for selecting the sensor element for picking up the inspection signal.

The electric signal to be applied may be either one of a voltage pulse signal or AC signal. When the voltage pulse is used, the polarity of the signal can be limited and thereby a circuit can be designed with limiting current passing through the sensor element in one direction. This provides a simplified circuit design.

Further, the computer 21 receives the inspection signal from the sensor unit 1 to detect a disconnection in the circuit wiring 101.

Each tip of the probes 22 is brought in contact with one of the ends of the corresponding circuit wiring 101 on the circuit board 100 to supply an electric signal to the circuit wirings 101.

The selector 23 switchingly selects the probe 22 for outputting the electric signal. The selector 23 performs the switching operation according to the control signal supplied from the computer so as to allow the electric signal to be supplied to the plurality of separate circuit wirings 101 on the circuit board 100 one by one. The selector 23 also connects the circuit wirings not to be applied with the electric signal to a low-impedance line, such as GND or a power supply. This is done to prevent an inspection signal from transmitting to the non-inspected circuit wiring due to crosstalk and being received by the sensor as an error signal.

The sensor unit 1 is disposed at a position opposed to the circuit wiring 101 of the circuit board 100 in a non-contact manner to detect potential variation generated on the circuit wiring 101 in response to the electric signal applied from the probe 22 and then to output the detected potential variation to the computer 21 as a detected signal. The distance between the sensor unit 1 and the circuit wiring is desirable to be 0.05 mm or less. However, it is acceptable to be 0.5 mm or less. Further, the circuit board and the sensor unit 1 may be brought into close contact with each other with interposing a dielectric insulating material therebetween.

While the circuit board 100 of FIG. 2 is described on the assumption that the circuit wirings 101 are formed on only one of the surfaces of the board. However, a circuit board formed with the circuit wirings 101 on both surfaces thereof can also be inspected. In this case, the circuit board is inspected by disposing a pair of sensor units 1 above and below with sandwiching the circuit board therebetween.

With referring to FIG. 3, the internal configuration of the computer 21 will be described below.

Figure 3:
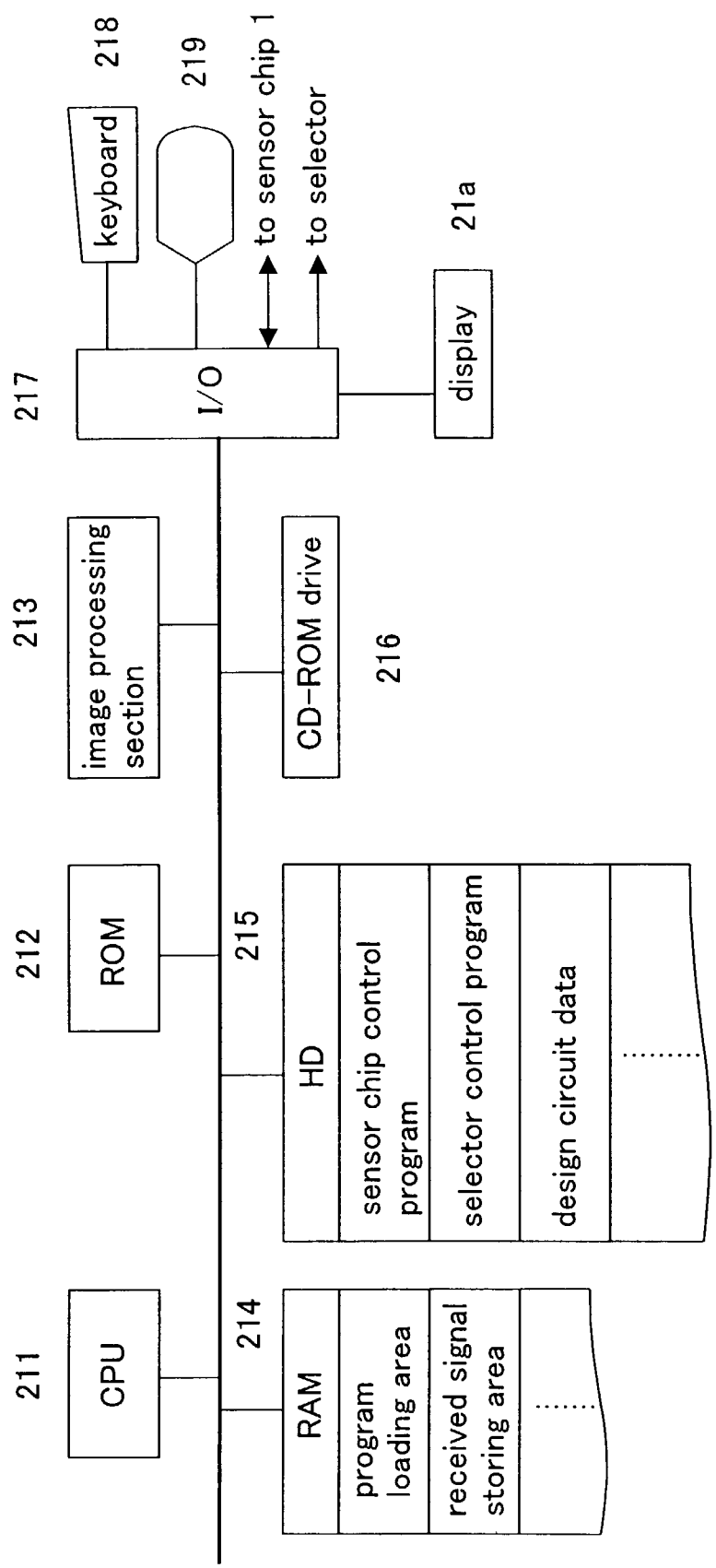
FIG. 3 is a schematic block diagram showing the hardware of a computer of the inspection system according to the first embodiment of the present invention.

FIG. 3 is a schematic block diagram showing the hardware of the computer 21.

The reference numeral 211 indicates an operation/control CPU for controlling the entire computer 21. The reference numeral 212 indicates a ROM for storing thereon a program to be executed in the CPU 211, a fixed value and others. The reference numeral 214 indicates a temporarily storing RAM including a program load area for storing a loaded program, a digital-signal storing area for storing a digital signal received from the sensor unit, and others.

The reference numeral 215 indicates a hard disk (HD) as an external storage unit. The reference numeral 216 indicates a CD-ROM drive as a detachable read unit for recording medium.

The reference numeral 217 indicates an input/output (I/O) interface. The computer receives/transmits a signal from/to a keyboard 218 and a mouse 219 as an input unit as well as the sensor unit 1 and the selector 23, through the I/O interface 217.

The HD 215 includes a sensor-unit control program, a selector control program and others stored therein, and these programs are loaded on the program load area of the RAM 214 and executed. Further, image data (CAD data) representing the shape of a design circuit wiring is stored in the HD 215.

The sensor-unit control program, the selector control program and the image data representing the shape of the designed circuit wiring may be installed by reading the CD-ROM with the CD-ROM drive. Alternatively, they may be read from other medium such as FD or DVD, or may be downloaded through a network.

Figure 4:
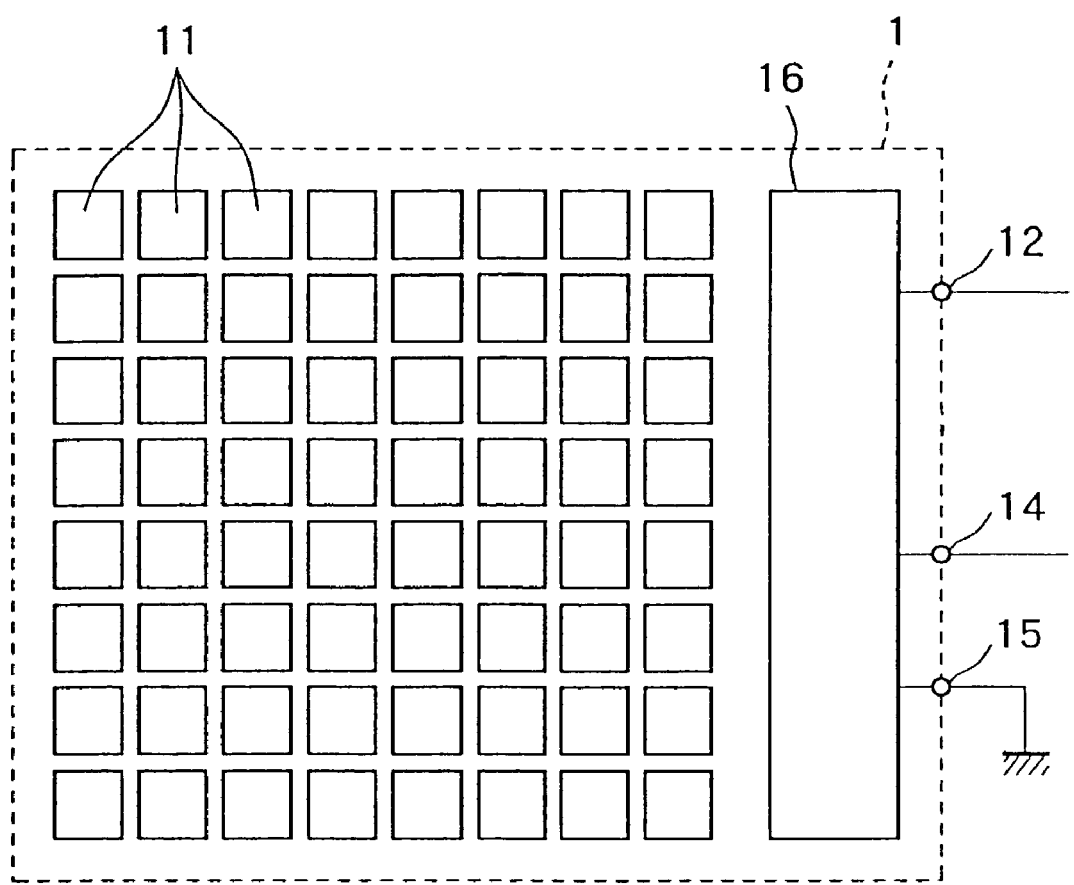
FIG. 4 is a schematic block diagram showing a sensor unit according to the first embodiment of the present invention.

As shown in FIG. 4, the sensor unit 1 includes a plurality of sensor elements 11 separately arranged each other, an output terminal 12 for outputting each inspection signal from the sensor elements 11, a control terminal 14 to which the control signal is inputted from the computer 21, a GND terminal 15 connected to GND, and a switching circuit 16 for switching the connection between each of the sensor elements 11 and the input terminal 12 or the output terminal 13 or GND terminal 15.

In the sensor unit 1, each of the sensor elements 11 is made of a conductive, such as a metal including aluminum and copper, or semiconductor material. Further, while the sensor elements 11 in the sensor unit 1 is two-dimensionally arranged in conformity with the shape of the circuit board 100, the sensor elements 11 may be three-dimensionally arranged.

Each shape of the sensor elements 11 is desirably uniformed. This is done to allow the each of the censor elements 11 to supply an electric signal to the conductive pattern and receive/transmit a signal appeared at the conductive pattern without any deviation of these signals.

The sensor elements 11 are desirably formed in a matrix form in which the sensor elements 11 are arranged at even intervals in the row and column directions. This arrangement provides reduced unevenness in the number per unit area of the sensor elements 11 opposed to the conductive pattern. In addition, this provides clarified relative physical relationship between the sensor elements 11, and thereby can facilitate to specify each position of the sensor elements 11.

In FIG. 4, the total number of the sensor elements 11 becomes 64. However, this number is determined only for the purpose of helping easy understanding of the description of this embodiment. By way of example, the sensor elements ranging from 200,000 to 2,000,000 may be actually provided within a square ranging from 5 to 50 $\mu$m on a side. In order to achieve more accurate inspection operation, each size or interval of the sensor elements 11 is desirably set to allow two of the sensor elements to be approximately encompassed within each line width of the conductive patterns.

Figure 5:
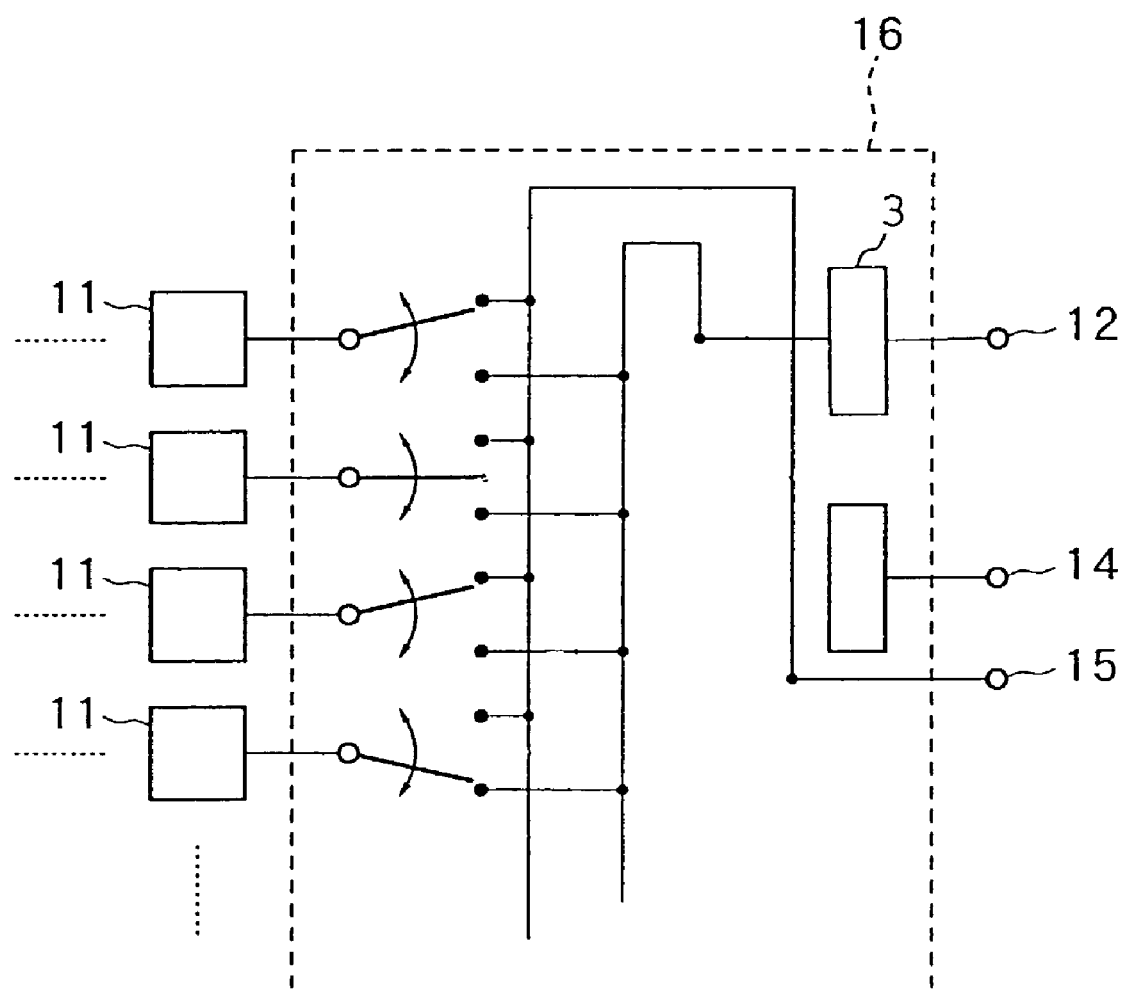
FIG. 5 is a schematic block diagram showing a switching circuit of the sensor unit according to the first embodiment of the present invention.

The switching circuit 16 may be composed, for example, of a multiplexer, demultiplexer and others. FIG. 5 is an internal block diagram of the switching circuit 16.

The switching circuit 16 connects each of the sensor elements 11 to either one of the output terminal 12 or GND terminal 15 individually according to the control signal from the computer 21.

In this embodiment, only one of the output terminal 12 is provided and an OR operation is performed based on the inspection signals from the plurality of sensor elements 11. That is, it is not important which of the sensor elements 11 has provided the detected inspection signal, and it is detected whether any one of the selected plural sensor elements has output a signal.

When picking up an inspection signal from either one of the sensor elements 11, it is desired to provide an enhanced S/N ratio of the inspection signal. This is the reason why each of the sensor elements 11 is adapted to be connected to the GND terminal 15. However, when a sufficient S/N ratio can be obtained without connecting to the GND terminal 15, the GND terminal 15 may be omitted and the sensor elements 11a may be simply switchingly opened.

The signal source generates a temporally variable electrical signal, such as an AC signal or pulse signal. In this embodiment, the signal source continuously generates an electric signal having a periodically variable voltage. For example, the period of voltage variation of the electric signal is desirably set in the range of 500 kHz to 10 MHz. While the signal source has been independently provided in this embodiment, such an electric signal may be generated from the computer 21.

A processing circuit 3 is provided to perform a signal processing for allowing each inspection signal from the sensor elements 11 to be readily handled by the computer 21. For example, the processing circuit 3 is composed of an amplifier for amplifying an inspection signal, a filtering circuit, an A/D converter and others.

The computer 21 transmits a control signal to the switching circuit 16 to determine the sensor element 11 to be selected. This selection is performed based on an image data (CAD data) representing the shape of the designed circuit wiring.

Figure 1:
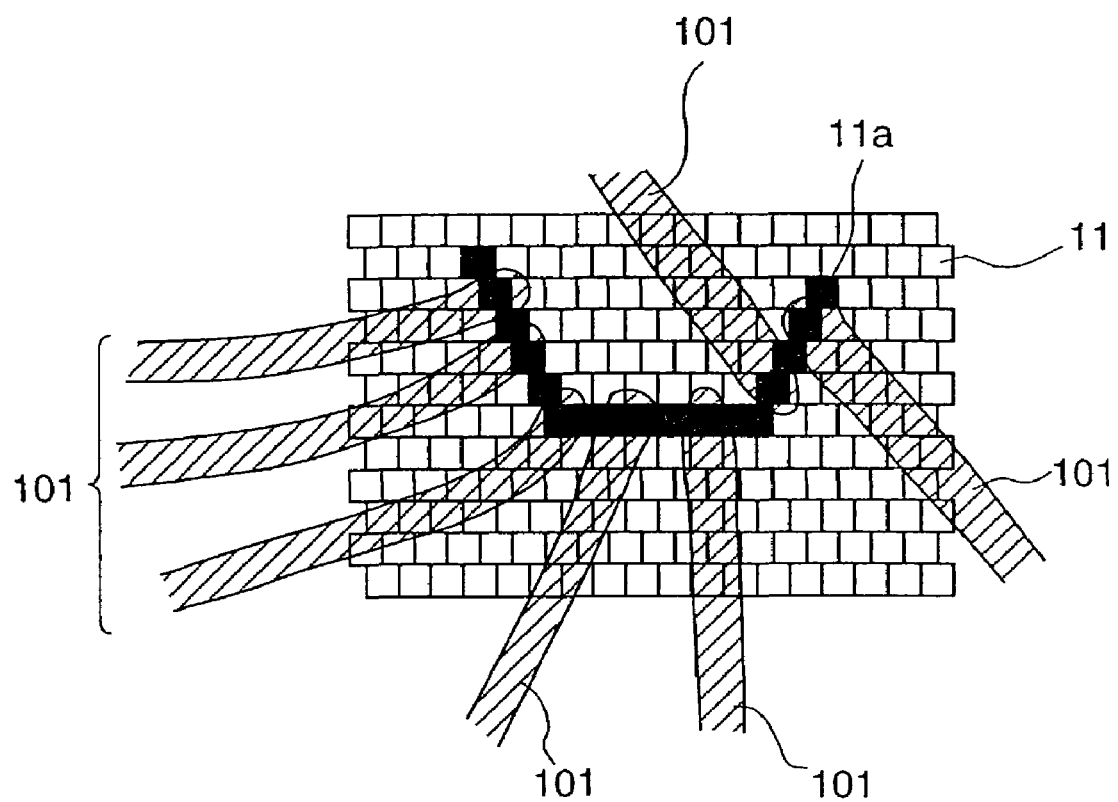
FIG. 1 is an explanatory diagram of a method for selecting a sensor element in an inspection apparatus according to a first embodiment of the present invention.

More specifically, as shown in FIG. 1, among the sensor elements 11 arranged in a matrix form, all of the sensor elements 11a adjacent to the other ends (the opposite ends of the ends in contact with the probe 22) of two or more circuit wirings 101 are selected. For this purpose, when a circuit board 100 as a subject of inspection is selected, the CAD data of the circuit wiring 101 on this circuit board 100 is first analyzed to detect the position of the end of each wiring. Then, two or more sensor elements 11a adjacent to the end (from which the voltage variation can be detected) are specified. Then, the switching circuit 16 is controlled to connect the selected sensor elements to the output terminal 12 and to connect the remaining sensor elements to the GND terminal 15.

In this state, when an voltage is applied to one of the selected circuit wirings and then an inspection signal (voltage variation) is output from the output terminal 12, it will be determined that no disconnection exists in the circuit wiring.

In this embodiment, a tester for detecting a disconnection in a circuit wiring is constructed by using the sensor elements arranged in a matrix form as described above mentioned. Thus, a common sensor unit can be used regardless of the shape of the circuit wiring, and thereby the inspection apparatus can have significantly enhanced productivity. Further, instead of scanning all sensor elements, an electric signal is output only from the selected sensor elements by switching the analog switch in advance. Thus, only one bit of data is output for each circuit wiring, and the signal processing can be performed at an extremely high speed.

While the sensor elements 11 in the sensor unit 1 are two-dimensionally arranged in conformity with the shape of the circuit board 100, it may be three-dimensionally arranged.

Each shape of all of the sensor elements 11 is desirably uniformed as shown in FIG. 4. This is done to supply an electric signal to the circuit wiring and receiving a signal appeared at the circuit wiring without any deviation between the sensor elements 11 evenly.

As shown in FIG. 4, the sensor elements 11 are desirably formed in a matrix form in which the sensor elements 11 are arranged at even intervals in the row and column directions. This arrangement provides reduced unevenness in the number per unit area of the sensor elements 11 opposed to the circuit wiring. In addition, this provides clarified relative physical relationship between the sensor elements 11, and thereby provides enhanced accuracy in inspection. In this manner, when setting each size or interval of the sensor elements 11 to achieve more accurate inspection operation, it is desirable to set each size and interval of sensor elements 11 depending on the line width of the circuit wiring.

The sensor element may be formed on a board made of a non-conductive material, such as glass, ceramic, glass epoxy or plastic, and may receive an electromagnetic wave radiated from the circuit wiring applied with an electric signal by a materials having a relatively high conductivity, such as a metal thin-film, polycrystalline semiconductor or non-crystalline semiconductor.

Further, while the potential variation of the circuit wiring is detected in this embodiment, the amount and radiation form of electromagnetic wave radiated from the circuit wiring may be detected. When a given amount and form of the electromagnetic wave are detected, it will be determined that the circuit wiring has a normal continuity. When, as compared to a given reference, a less amount and different form are detected, it will be determined that a disconnection or chipping exists in the circuit wiring.

Further, while the probe is brought into contact with the end of the circuit wiring in this embodiment, an electric signal may be input from the initial point of the circuit wiring by using a non-contact type terminal.

(Second Embodiment)

Figure 6:
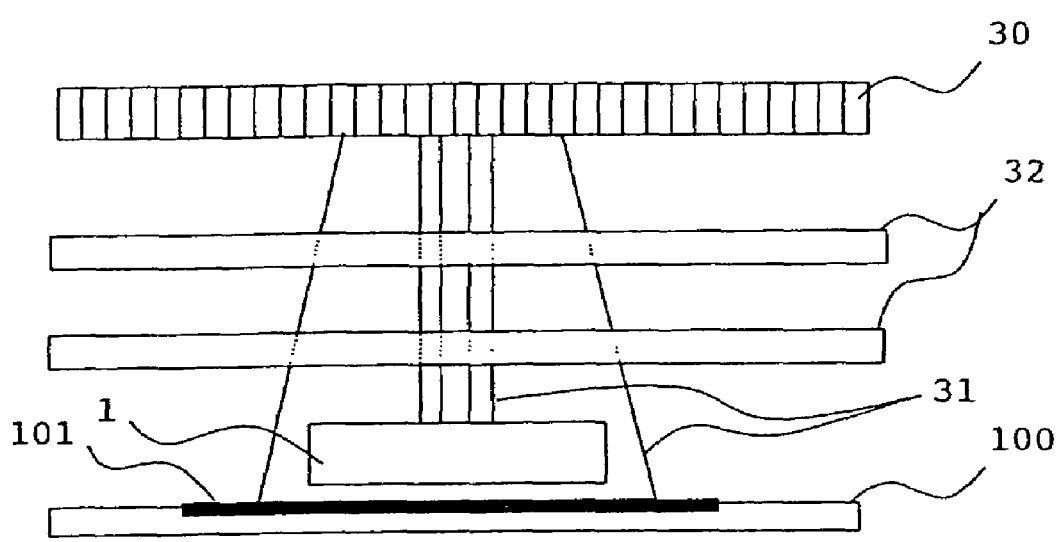
FIG. 6 is a schematic diagram of an inspection system according to a second embodiment of the present invention.

With referring to FIG. 6, an inspection system according to a second embodiment of the present invention will be described below.

The inspection system according to this embodiment facilitates to supply a signal to the sensor unit and circuit board and to detect the signal by using a universal tester having a number of electrodes arranged in a matrix form. The construction and function of the sensor unit itself are the same as those of the above first embodiment, and thereby these descriptions will be omitted.

Each electrode of a universal tester 30 is connected with each terminal of a sensor unit 1 and the end of each wiring of a circuit board 100 by using a connecting probe 31. Four probes composed of two for sharing a power supply, one for outputting a select signal and one for detecting a signal are connected to the sensor unit 1. The probes having the same number as that of the ends of the wirings are connected to the circuit board 100. Further, a positioning plate 32 is disposed between the universal tester and the sensor unit 1 to help connecting the probes to the sensor unit and the board reliably.

According to this embodiment, the wirings between the sensor unit 1 and the computer 21 can be integrated. In particular, when a large-size circuit board is inspected using a plurality of sensor units, the construction of the apparatus can be further simplified.

INDUSTRIAL APPLICABILITY

The present invention can provide an inspection apparatus and an inspection method capable of inspecting at a high speed by using a sensor having flexibility and excellent productivity.

What is claimed is:

1. An inspection apparatus for inspecting a circuit wiring on a circuit board, said inspection apparatus comprising:
   supply means for supplying an electric signal to one of the ends of a circuit wiring and varying a voltage in said circuit wiring;
   sensor means including a plurality of sensor elements arranged in an array, each of said sensor elements being adapted to generate an inspection signal in response to voltage variation of a conductor adjacent thereto;
   sensor element select means for selecting at least one sensor element adjacent to the other end of said circuit wiring among said plurality of sensor elements; and
   output means for outputting the inspection signal from said selected sensor element,
   wherein said sensor element select means includes a first switching means for controlling the connection between each of said sensor elements and the ground, and said sensor means is a unit that includes a built-in second switching means for controlling the connection between each of said sensor elements and said output means.

2. An inspection apparatus as defined in claim 1, wherein said supply means is adapted to supply the electric signal to selected one of a plurality of circuit wirings on said circuit board,
   said sensor element select means is adapted to select all of the sensor elements adjacent to respective ends of said plurality of circuit wirings, and
   when the inspection signal is generated in at least one of said sensor elements selected by said sensor element select means, said output means is adapted to output said inspection signal.

3. An inspection apparatus as defined in claim 1, which further includes detect means for detecting a disconnection in said circuit wiring according to the inspection signal output from said output means.

4. An inspection system for inspecting a circuit wiring on a circuit board, said inspection system comprising a plurality of inspection apparatuses each as defined in either claim 1 or claim 2, said inspection apparatuses being adapted to be disposed opposed to the circuit board.

5. An inspection system as defined in claim 4, which further includes a universal tester adapted to be connected to the plurality of inspection apparatuses.

6. An inspection method for inspecting a circuit wiring on a circuit board by using sensor means including a plurality of sensor elements arranged in an array, each of said sensor elements being adapted to generate an inspection signal in response to voltage variation of a conductor adjacent thereto, and by using sensor element select means for selecting at least one sensor element among said plurality of sensor elements, said inspection method comprising the steps of:
   supplying the electric signal to one of the ends of the circuit wiring and varying a voltage in said circuit wiring;
   selecting at least one sensor element adjacent to the other end of said circuit wiring among said plurality of sensor elements; and
   detecting a disconnection in said circuit wiring according to an output signal output from said sensor element selected in said step of selecting at least one sensor element,
   wherein said sensor element select means includes a first switching means for controlling the connection between each of said sensor elements and the ground, and said sensor means is a unit that includes a built-in second switching means for controlling the connection between each of said sensor elements and an output means for outputting the inspection signal from said selected sensor element.

7. An inspection method as defined in claim 6, wherein a plurality of circuit wirings on the circuit board are simultaneously inspected by arranging said sensor means in the plural number.

* * * * *